United States Patent [19]
Ōsawa

[11] Patent Number: 5,636,225
[45] Date of Patent: Jun. 3, 1997

[54] MEMORY TEST CIRCUIT

[75] Inventor: Tokuya Ōsawa, Tokyo, Japan

[73] Assignee: Mitsubishi Denki Kabushiki Kaisha, Tokyo, Japan

[21] Appl. No.: 608,049

[22] Filed: Feb. 28, 1996

[30] Foreign Application Priority Data

Sep. 28, 1995 [JP] Japan .................. 7-250936

[51] Int. Cl.$^6$ ........................................ G11C 29/00
[52] U.S. Cl. .................. 371/21.1; 371/21.2; 371/21.3; 371/22.5
[58] Field of Search ............... 371/21.1, 21.2, 371/22.5, 25.1, 21.3; 365/230.01, 201; 307/480

[56] References Cited

U.S. PATENT DOCUMENTS

| | | | |
|---|---|---|---|
| 5,101,409 | 3/1992 | Hack | 371/21.3 |
| 5,198,709 | 3/1993 | O'Connell | 307/480 |
| 5,258,986 | 11/1993 | Zerbe | 371/21.2 |
| 5,323,355 | 6/1994 | Kato | 365/230.01 |
| 5,327,363 | 7/1994 | Akiyama | 364/580 |
| 5,471,482 | 11/1995 | Byers et al. | 371/21.2 |

FOREIGN PATENT DOCUMENTS

| | | |
|---|---|---|
| 64-70999 | 3/1989 | Japan . |
| 4-302899 | 10/1992 | Japan . |

*Primary Examiner*—Robert W. Beausoliel, Jr.
*Assistant Examiner*—Nadeem Iqbal

[57] ABSTRACT

It is an object to reduce circuit scale and increase operation speed of a memory test circuit which performs a memory test according to the ping-pong pattern. An address signal of a remarked cell is generated by an LFSR (76) and address signals for other cells are generated by an LFSR (75). The LFSR (76) updates the generated address signal every time the LFSR (75) generates one cycle of address signals. The address signals of the LFSR's (75, 76) are alternately switched by a selector circuit (78) and outputted to a RAM (2A).

12 Claims, 10 Drawing Sheets

MEMORY TEST CIRCUIT

BACKGROUND OF THE INVENTION

1. Field of the Invention

The present invention relates to memory test circuits for performing tests of semiconductor memories, and particularly to a memory test circuit for performing tests of Random Access Memories (referred to as RAM, hereinafter) using ping-pong pattern.

2. Description of the Background Art

Input/output pins of a RAM provided in an application specific IC (ASIC) etc. are usually connected to a logic portion, from which signals are provided to the RAM, so that tests can not be applied directly to the RAM using external pins. FIG. 8 shows a configuration of a chip in which a memory test circuit for performing tests of RAM is provided in the chip to enable tests of a built-in RAM. Here, the memory test circuit built in the chip 1 is referred to as a RAM-BIST (Built In Self Test) circuit.

In the normal operation, that is, when a test pin 8 is supplied with "0" as a signal RAM-TEST, data inputted from external input pins 3 are processed in a logic portion 5 and then the processed data is provided to a RAM 2. Data outputted from the RAM 2 is provided to a logic portion 6. Data processed in the logic portion 6 is externally outputted from external output pins 4.

When the signal RAM-TEST provided to the test pin 8 is at "1", input pins of the RAM 2 built in the chip 1 are separated from the logic portion 5 by a selector circuit 9 and the RAM 2 is tested by a RAM-BIST circuit 7. The RAM-BIST circuit 7 performs functions of generating test patterns, comparing tested outputs and expected values, compressing test results, etc. This RAM-BIST circuit 7 generates various address patterns to test the RAM.

Next, a description will be made on generation of address patterns in the RAM-BIST circuit 7 referring to FIG. 9. FIG. 9 is a block diagram for describing a configuration of an address pattern generating circuit provided in the RAM-BIST circuit 7 shown in FIG. 8 for generating ping-pong pattern which is a kind of test pattern. In FIG. 9, 2A denotes a RAM in which memory cells are selected with 4-bit address input signals A0, A1, A2, A3, 10 denotes a first counter, 11 denotes a second counter, and 12 denotes a selector circuit for selectively outputting one of the first and second counters to the RAM 2A in accordance with a selection signal sel.

The ping-pong pattern is a test pattern with very high detecting ability. The algorithm of a memory test according to the ping-pong pattern will now be described. First, the RAM-BIST circuit 7 writes "0" into all memory cells in the RAM 2A. Next, it writes "1" into a remarked memory cell, a memory cell at the address "0000", for example. Then, the RAM-BIST circuit 7 performs read operation according to the ping-pong pattern in the order of address 1, address 0, address 2, address 0, address 3, address 0, . . . address 0, address N, for example. In the ping-pong pattern, "0" is written in the address 0, and if a remarked cell is the address 1, for example, "1" is written in the address 1, and the same operation as that described above is performed about the remarked cell. That is to say, reading is carried out in the order of address 0, address 1, address 2, address 1, address 3, address 1, . . . address 1, address N. Then, "0" is written into address 1. In the ping-pong pattern, the remarked cell is shifted to the address N, and the operation of alternately reading the remarked cell and other cells as described above is performed every time "1" is written into a remarked cell.

A conventional circuit for generating address pattern according to the ping-pong pattern includes a second counter 11 for generating address signals for remarked cells and a first counter 10 for generating address signals for other cells, which is configured so that outputs of the two counters 10 and 11 are switched by the selector circuit 12 for every cycle.

The EN0 and EN1 are control signals for stopping operations of the first and second counters, respectively.

The control signals EN0 and EN2 control so that the first counter 10 operates for every cycle of clock, and the second counter 11 operates for every (the number of addresses of a tested circuit×2 cycles), in the case of the test of the RAM 2A shown in FIG. 8, every 4×2 cycles, respectively. The selector circuit 12 is controlled by the selection signal sel to switch outputs of the first counter 10 and the second counter 11 every cycle.

Next, a counter circuit forming the RAM-BIST circuit 7 will be described. FIG. 10 is a logic diagram showing a configuration of a 4-bit counter. In FIG. 10, 15–18 denote flip-flops which operate in synchronization with a clock T, 19 denotes an NOT gate for providing a negation of output of the flip-flop 15 to the input terminal of the flip-flop 15, 20 denotes an EXCLUSIVE-OR gate (referred to as an XOR gate, hereinafter) for applying "1" to the input terminal of the flip-flop 16 when the output of the flip-flop 15 and the output of the flip-flop 16 differ, 21 denotes an AND gate for outputting "1" when outputs of the flip-flops 15 and 16 are both "1", 22 denotes an AND gate for outputting "1" when the output of the AND gate 21 and the output of the flip-flop 18 are both "1", 23 denotes an XOR gate for outputting "1" to the input terminal of the flip-flop 17 when the output of the AND gate 22 and the output of the flip-flop 17 differ and 24 denotes an XOR gate for outputting "1" to the input terminal of the flip-flop 18 when the output of the flip-flop 18 and the output of the AND gate 21 differ.

In order to operate as a counter, the circuit shown in FIG. 10 provides outputs DO<*> of the flip-flops as input data DI<*> so that the numbers enclosed in <> are equal.

FIG. 11 is a logic diagram showing a configuration of a 10-bit counter. The counter shown in FIG. 11 is formed for the purpose of decreasing the occupied area without attaching importance to the operating speed. In FIG. 11, 30–39 denote flip-flops operating in synchronization with a clock T, 40 denotes an NOT gate for providing a negation of the output of the flip-flop 30 to the input terminal of the flip-flop 30, 41 denotes an XOR gate for applying "1" to the input terminal of the flip-flop 31 when the output of the flip-flop 30 and the output of the flip-flop 31 differ, 42 denotes an AND gate for outputting "1" when the output of the flip-flop 30 and the output of the flip-flop 31 are both "1", 43 denotes an AND gate for outputting "1" when the output of the AND gate 42 and the output of the flip-flop 39 are both "1", 44 denotes an XOR gate for outputting "1" to the input terminal of the flip-flop 32 when the output of the flip-flop 32 and the output of the AND gate 43 differ, 45 denotes an NAND gate for outputting "0" when the output of the flip-flop 32, the output of the AND gate 43, and the output of the flip-flop 34 are all "1", 46 denotes an NOT gate for outputting a negation of the output of the flip-flop 33, 47 denotes an XOR gate for applying "1" to the input terminal of the flip-flop 33 when the output of the NOT gate 46 and the output of the NAND gate 45 differ, 48 denotes an AND gate for outputting "1" when the output of the flip-flop 32 and the output of the AND gate 43 are both "1", 49 denotes an XOR gate for applying "1" to the input terminal of the flip-flop 34 when the output of the flip-flop 34 and the output of the AND gate 48 differ, 50 denotes an OR gate for outputting "1" when either one of the output of the NAND gate 45 and the output of the NOT gate 46 is "1", 51 denotes an NOT gate for outputting a negation of the output of the flip-flop 37, 52 denotes an NOR gate for outputting "0" when either one of the output of the OR gate 50 and the output of the NOT gate 51 is "1", 53 denotes an AND gate for outputting "1" when the output of the NOR gate 52 and the output of the flip-flop 36 are both "1", 54 denotes an AND gate for outputting "1" when the output of the AND gate 53 and the output of the flip-flop 38 are both "1", 55 denotes an XOR gate for applying "1" to the input terminal of the flip-flop 35 when the output of the flip-flop 35 and the output of the AND gate 54 differ, 56 denotes an XOR gate for outputting "1" to the input terminal of the flip-flop 36 when the output of the NOR gate 52 and the output of the flip-flop 36 differ, 57 denotes an XOR gate for outputting "1" to the input terminal of the flip-flop 37 when the output of the NOT gate 51 and the output of the OR gate 50 differ, 58 denotes an XOR gate for applying "1" to the input terminal of the flip-flop 38 when the output of the flip-flop 38 and the output of the AND gate 53 differ, and 59 denotes an XOR gate for outputting "1" to the input terminal of the flip-flop 39 when the output of the flip-flop 39 and the output of the AND gate 42 differ.

To operate as a counter, the circuit shown in FIG. 11 provides the outputs DO<*> of the flip-flops as the input data DI<*> so that the numbers enclosed in the <> are equal.

FIG. 12 is a logic diagram showing a configuration of a 10-bit counter operating at higher speed than the 10-bit counter shown in FIG. 11. In FIG. 12, 60–69 denote flip-flops operating in synchronization with the clock T, 70 denotes an NOT gate for applying a negation of the output of the flip-flop 69 to the input terminal of the flip-flop 69, 71 denotes an NAND gate for outputting "0" only when the outputs of the flip-flops 65, 66, 69 are all "1", 72 denotes an NOT gate for performing Boolean operation for negating the output of the NAND gate 71 and outputting its result, 73 denotes an XOR gate for applying "1" to the input terminal of the flip-flop 68 when the output of the flip-flop 68 and the output of the NOT gate 72 differ, 74 denotes an AND gate for outputting "1" when the output of the flip-flop 68 and the output of the flip-flop 64 are both "1", 75 denotes an AND gate for outputting "1" when the outputs of the NOT gate 72 and the AND gate 74 are both "1", 76 denotes an AND gate for outputting "1" when the outputs of the flip-flops 60, 62 are both "1", 77 denotes an AND gate for outputting "1" when the outputs of the AND gates 75, 76 are both "1", 78 denotes an NOT gate for outputting a result of Boolean operation for negating the output of the flip-flop 67, 79 denotes an NAND gate for outputting "0" only when the output of the AND gate 77 and the output of the flip-flop 61 are both "1", 80 denotes an XOR gate for outputting "1" to the input terminal of the flip-flop 67 when the output of the NOT gate 78 and the output of the NAND gate 79 differ, 81 denotes an XOR gate for outputting "1" to the input terminal of the flip-flop 66 when the outputs of the flip-flops 66, 69 differ, 82 denotes an AND gate for outputting "1" when the outputs of the flip-flops 66, 69 are both "1", 83 denotes an XOR gate for outputting "1" to the input terminal of the flip-flop 65 when the output of the flip-flop 65 and the output of the AND gate 82 differ, 84 denotes an AND gate for outputting "1" when the output of the flip-flop 68 and the output of the NOT gate 72 are both "1", 85 denotes an XOR gate for outputting "1" to the input terminal of the flip-flop 64 when only one of the output of the flip-flop 64 and the output of the AND gate 84 is "1", 86 denotes an NOR gate for outputting "0" when either one of the output of the NAND gate 79 and the output of the NOT gate 78 is "1", 87 denotes an NOT gate for outputting a result of Boolean operation of negation of the output of the flip-flop 63, 88 denotes a selector receiving the output of the flip-flop 63 and the output of the NOT gate 87 as inputs for outputting the output of the NOR gate 86 as a select signal to the input terminal of the flip-flop 63, 89 denotes an AND gate for outputting "1" when the output of the flip-flop 60 and the output of the AND gate 75 are both "1", 90 denotes an XOR gate for outputting "1" to the input terminal of the flip-flop 62 when the output of the AND gate 89 and the output of the flip-flop 62 differ, 91 denotes an XOR gate for applying "1" to the input terminal of the flip-flop 61 when the output of the flip-flop 61 and the output of the AND gate 77 differ, and 92 denotes an XOR gate for applying "1" to the input terminal of the flip-flop 60 when the output of the flip-flop 60 and the output of the AND gate 75 differ.

To operate as a counter, the circuit shown in FIG. 12 provides the outputs DO<*> of the flip-flops as the input data DI<*> so that the numbers in <> are equal.

Operation of the selector 88 is shown in Table 1.

TABLE 1

| Output of D flip-flop 62 | Negation of output of D flip-flop 62 | Output of NOR gate 86 | Output of selector 88 |
|---|---|---|---|
| H | x | H | L |
| L | x | H | H |
| x | H | L | L |
| x | L | L | H |

In the conventional memory test circuit configured as described above, two counters are used in a memory test pattern generating circuit provided in the memory test circuit for generating the ping-pong pattern which is a kind of memory test pattern. The counters are complicated in structure and slow in operation, causing a problem of enlarged scale and slow speed of the memory test circuit.

The problem becomes more serious as the number of bits of the RAM increases, as the scale of the structure of the 10-bit counter becomes more complicated and larger as compared with the 4-bit counter shown in FIG. 10, not in proportion to the increase in number of bits.

Furthermore, as the number of addresses of a tested circuit increases, a counter with a higher speed is required for addressing in the real operation of the tested circuit, which causes a problem of a further increase in scale of the circuit, as can be clearly seen by comparing the counters shown in FIG. 11 and FIG. 12.

SUMMARY OF THE INVENTION

According to a first aspect of the present invention, a memory test circuit comprises: selection signal generating means for repeatedly outputting a selection signal; a first address signal generating circuit which updates a first address signal generated to select a memory cell in a memory in response to the selection signal received from the selection signal generating means; a second address signal generating circuit which updates a second address signal generated for selection of the memory cell every time the first address signal generating circuit has finished outputting all kinds of the first address signals once; and a selector circuit receiving the first and second address signals which the first and second address signal generating circuits generate for selecting one of the first and second address signals with the selection signal provided from the selection signal generating means and outputting the signal as selected to the memory; and the first address signal generating circuit includes a first linear feedback shift register having a plurality of first registers connected in series, and a first exclusive OR circuit having an output terminal connected to the first register on the first stage in the plurality of first registers, a first input terminal connected to a first feedback path, and a second input terminal, and a first NOR gate for executing NOT-OR operation of outputs of all the first registers except the first register on the final stage in the plurality of first registers and outputting its result to the second input terminal of the first exclusive OR circuit.

Preferably, according to a memory test circuit of a second aspect of the present invention, the second address signal generating circuit comprises a second linear feedback shift register having a plurality of second registers connected in series and a second exclusive OR circuit having an output terminal connected to the second register on the first stage in the plurality of second registers, a first input terminal connected to a second feedback path and a second input terminal, and a second NOR gate for executing NOT-OR operation of outputs of all the second registers except the second register on the final stage in the second plurality of registers and outputting its result to the second input terminal of the second exclusive OR circuit.

Preferably, according to a third aspect of the present invention, the memory test circuit further includes detecting means for detecting that all kinds of the first address signals have been outputted once, by the first address signal generating circuit wherein the second address signal generating circuit includes a counter for counting outputs of the detecting means.

Preferably, according to a fourth aspect of the present invention, in the memory test circuit, the selection signal generating means includes a ring counter formed of two registers capable of external input of the memory test circuit of initial data and connected in the form of a ring.

Preferably, according to a fourth aspect of the present invention, the memory test circuit is provided in the same chip with the memory, and further comprises comparing means for comparing an output of the memory and an expected value, and control means for generating a comparison control signal inhibiting comparing operation of the comparing means when the first and second address signals are the same.

The present invention has been made to solve such problems as described before, and it is an object of the present invention to simplify a circuit generating memory test pattern to reduce circuit scale of a memory test circuit and to increase the operating speed.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
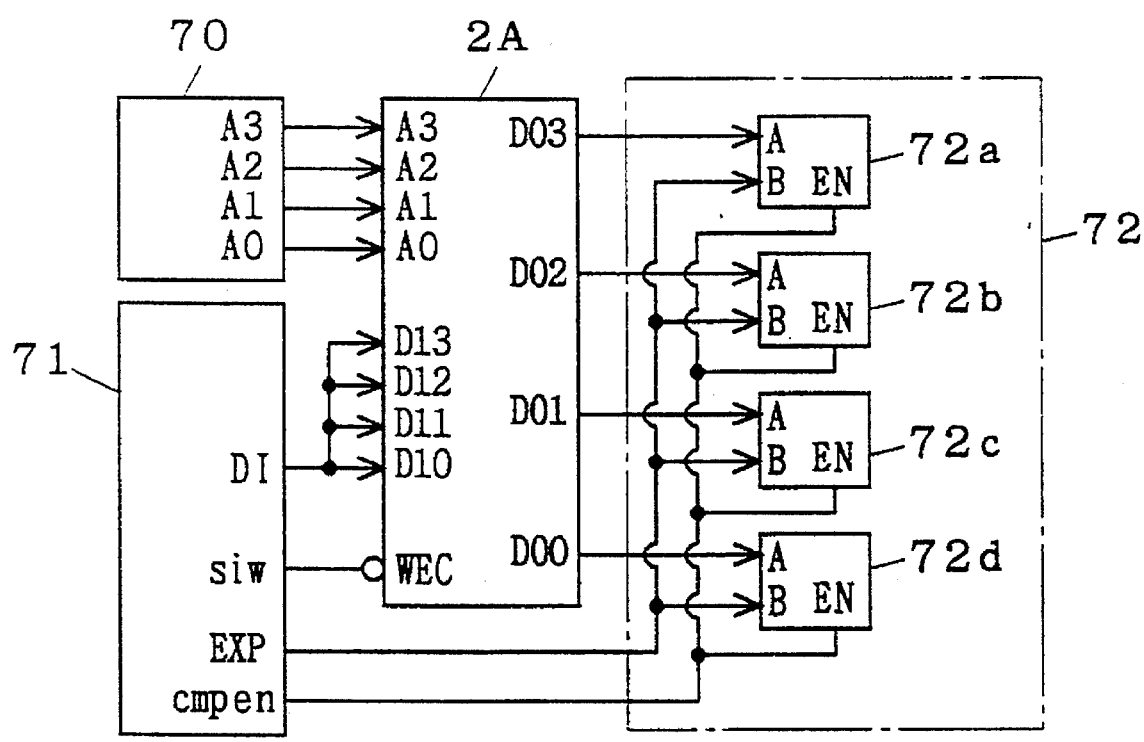
FIG. 1 is a block diagram for illustrating an outline of a memory test circuit of the present invention.

FIG. 1 is a block diagram showing the relation between a RAM-BIST circuit which is a kind of memory test circuit according to the present invention and a RAM. FIG. 1 shows the relation between the RAM and the RAM-BIST circuit when a memory test is made, which does not show relations between the RAM and other parts such as a logic portion. In FIG. 1, 2A is a RAM in which memory cells are selected with 4-bit address signals, 70 is a test pattern generating portion for generating memory test pattern, 71 is a control portion for generating test data and expected values for making the memory test, and control signals for controlling operations of respective parts of the RAM 2A and the RAM-BIST circuit, and 72 is a comparing portion for comparing the expected values provided from the control portion 71 and outputs of the RAM 2A.

The control portion 71 outputs data DI0–DI3 to the RAM 2A. DI is a data input signal of the RAM 2A. The control portion 71 also outputs to the RAM 2A a signal siw for switching write/read. The signal siw is a write signal for a tested circuit, the RAM 2A here. When the write signal siw=0, data writing into the RAM 2A is performed.

The control portion 71 outputs to the comparing portion 72 expected values EXP corresponding to address signals A0–A3 generated by the test pattern generating portion 70. The control portion 71 outputs to the comparing portion 72 a comparison signal compen for permitting comparison.

First Preferred Embodiment

Figure 2:
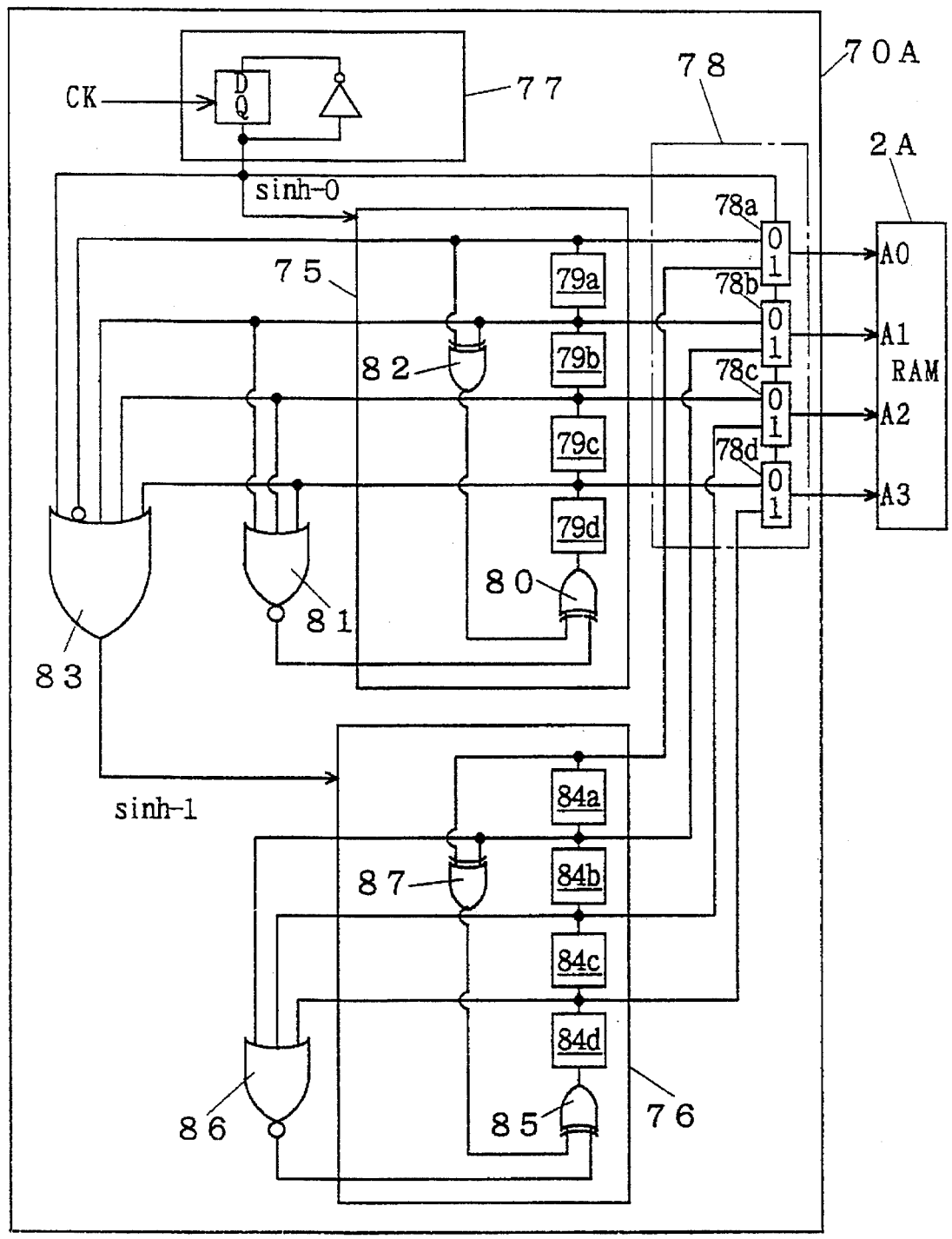
FIG. 2 is a logic diagram showing a configuration of a test pattern generating portion according to a first preferred embodiment of the present invention.

A structure of the test pattern generating portion according to a first preferred embodiment of the present invention will now be described referring to FIG.2. FIG. 2 is a logic diagram showing the structure of the test pattern generating portion for generating the ping-pong pattern according to the first preferred embodiment of the present invention. The test pattern generating portion for generating the ping-pong pattern shown in FIG.2 includes two linear feedback shift registers (referred to as LFSR, hereinafter) 75, 76, a selector circuit 78 for selectively outputting outputs of the two LFSR's 75, 76, a toggle flip-flop (referred to as a T flip-flop, hereinafter) 77 which serves as selection signal generating means for providing switch timing to the selector circuit 78, and NOR gates 81, 86 for causing the LFSR's 75, 76 to output "0000".

Now, the LFSR 75 and the NOR gate 81 serve as a first address signal generating circuit for generating address signals for cells other than a remarked cell, and the LFSR 76 and the NOR gate 86 serve as a second address signal generating circuit for generating an address signal of the remarked cell. Generally, the LFSR is a circuit generating pseudo-random numbers. However, a series of pseudo-random numbers generated by the LFSR arranged in the order of generation has a certain cycle, in which all numbers having possibilities of being generated each appear once in its one cycle. Accordingly, it is possible to generate ping-pong pattern by using the two LFSR's 75 and 76 which are configured to output "0000" with the NOR gates 81 and 86 and the XOR gates 80 and 85. The XOR gates 80, 85 have one terminals connected to output terminals of the XOR 82 and 87 which are feedback paths of the LFSR's 75 and 76, other terminals connected to output terminals of the NOR gates 81 and 86, and output terminals connected to registers 79d and 84d on the first stage, respectively.

Table 2 shows pattern of the address signals A0–A3 outputted from the LFSR for each clock in the case where "0" is initially set in all registers in the LFSR 75 of FIG. 2. The LFSR repeatedly outputs the output patterns of address signals shown in Table 2. That is to say, the 16 kinds of patterns shown in Table 2 correspond to one cycle of the LFSR.

TABLE 2

|    | A3 | A2 | A1 | A0 |
|----|----|----|----|----|
| 0  | 0  | 0  | 0  | 0  |
| 1  | 1  | 0  | 0  | 0  |
| 2  | 0  | 1  | 0  | 0  |
| 3  | 0  | 0  | 1  | 0  |
| 4  | 0  | 0  | 0  | 1  |
| 5  | 1  | 1  | 0  | 0  |
| 6  | 0  | 1  | 1  | 0  |
| 7  | 1  | 0  | 1  | 1  |
| 8  | 0  | 1  | 0  | 1  |
| 9  | 1  | 0  | 1  | 0  |
| 10 | 1  | 1  | 0  | 1  |
| 11 | 1  | 1  | 1  | 0  |
| 12 | 1  | 1  | 1  | 1  |
| 13 | 0  | 1  | 1  | 1  |
| 14 | 0  | 0  | 1  | 1  |
| 15 | 0  | 0  | 0  | 1  |

The T flip-flop 77 generates a signal for switching the selector circuit 78, which signal is also used as a shift inhibit signal sinh-0 for inhibiting shift operation of the LFSR 75 at the same time.

Though not shown, the LFSR's 75 and 76 and the T flip-flop 77 are provided with clock signal.

The T flip-flop generates the shift inhibit signal sinh-0 for each cycle as 010101..., in other words so that "0" and "1" alternately appear. Accordingly, the LFSR 75 performs shift operation once for every clock two cycles. A shift inhibit signal sinh-1 outputted from the NOR gate 83 to the LFSR 76 goes "0" when the output of the LFSR 75 is "0001" and the shift inhibit signal sinh-0 is "0", and at this time the LFSR 76 performs a shift operation. That is to say, the LFSR 76 performs a shift operation only once for each cycle of address signals which the LFSR 75 outputs, that is, every time the LFSR 75 has finished generating all kinds of outputable address signals. When the shift inhibit signals sinh-0=1 and sinh-0=1, the LFSR's 75 and 76 inhibit shift operation and hold current values independently of the clock.

The selection signal of the selector circuit 78 is the shift inhibit signal sinh-0. Hence, the RAM 2A is alternately provided by the selector circuit 78 with the address pattern generated by the LFSR 75 and the address pattern generated by the LFSR 76.

Figure 3:
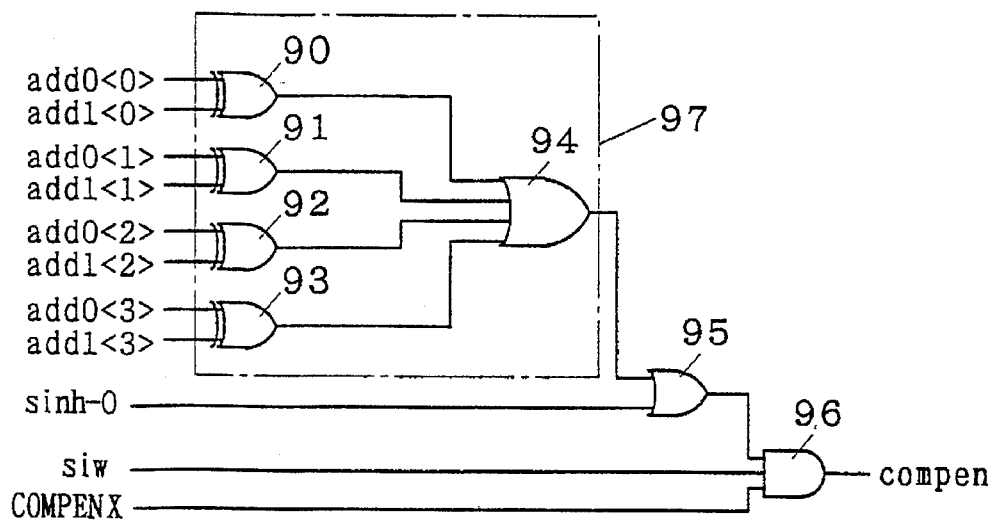
FIG. 3 is a logic diagram showing a part of a configuration of the control portion shown in FIG. 1.

Next, a structure provided in the control portion 71 for generating a comparison signal compen in the case where the ping-pong pattern is generated will be described referring to FIG. 3. In FIG. 3, compen denotes a signal for permitting comparison of data output of the RAM 2A and the expected value EXP, 90 denotes an XOR gate for outputting "0" only when the least significant bit add0<0> of an address signal which the LFSR 75 outputs and the least significant bit add1<0> of an address signal which the LFSR 76 outputs match, 91 denotes an XOR gate for outputting "0" only when the second bits add0<1> and add1<1> of the LFSR's 75 and 76 match, 92 denotes an XOR gate for outputting "0" only when the third bits add0<2> and add1<2> of the LFSR's 75 and 76 match, 93 denotes an XOR gate for outputting "0" only when the most significant bits add0<3> and add1<3> of the LFSR's 75 and 76 match, 94 denotes an OR gate for outputting "0" only when all outputs of the XOR gates 90–93 are "0", 95 denotes an OR gate for outputting OR of output of the OR gate 94 and the shift inhibit signal sinh-0, 96 denotes an AND gate for outputting AND of the output of the OR gate 95, the write signal siw and the signal CMPENX as a comparison signal compen, and 97 denotes a coincidence detecting circuit formed of the XOR gates 90–93 and the OR gate 94. The comparing portion 72 compares the data output D00–D03 of the RAM 2A and the expected value EXP when the signal compen=1.

The coincidence detecting circuit 97 outputs "0" only when the address signal add0 outputted by the LFSR 75 and the address signal add1 outputted by the LFSR 76 coincide. The signal compenx is rendered "0" in a normal operation or in a write cycle (e.g. in operation of previously writing "0" into all memory cells). When the signal compenx is "0", the comparison signal compen is "0". The comparison signal compen is brought to "1" in a memory test. When the comparison signal compen is "1", if add0=add1 and sinh-0=0, then the comparison signal compen=0 is satisfied, and if the write signal siw=0, then the comparison signal compen=0 is satisfied, and in other cases, the comparison signal compen=1 is satisfied.

The write signal siw, the input data DI and the comparison signal compen can be generated as follows in relation to the address generating circuit.

Here, address patterns generated by the LFSR 75 and the LFSR 76 are taken as add0 and add1, respectively. An initial value of one cycle of address signals generated by the LFSR 75 is taken as add0="0000", and its final value is taken as add0="0001"

The input data DI is set so that DI="1111" when the address signal add0="0000" and the shift inhibit signal sinh-0=1, and DI="0000" when the address signal add0="0001" and the shift inhibit signal sinh-0=1.

The write signal siw is set so that the write signal siw=0 when the address signal add0="0000" and the shift inhibit signal sinh-0=1, and the write signal siw=0 when the address signal add0="0001" and the shift inhibit signal sinh-0=1, and when the address signal add0 and the shift inhibit signal sinh-0 make other combinations, the write signal siw=1. The expected value EXP in reading has the same value as the shift inhibit signal sinh-0.

Table 3 shows the ping-pong pattern which the test pattern generating portion 70A shown in FIG. 2 generates and algorithm of a memory test made according to the ping-pong pattern.

TABLE 3

| Address generating circuit | | | | Tested circuit (RAM) | | | | | | |
|---|---|---|---|---|---|---|---|---|---|---|
| sinh-0 | add0 | sinh-1 | add0 | Address of RAM | DI | siw | compen | EXP | Operation | |
| 1 | 0000 | 1 | 0000 | 0000 | 1 | 0 | 1 | 1 | 1write | ⎫ |
| 0 | 0000 | 1 | 0000 | 0000 | x | 1 | 0 | 0 | — | |
| 1 | 1000 | 1 | 0000 | 0000 | x | 1 | 1 | 1 | 1read | |
| 0 | 1000 | 1 | 0000 | 1000 | x | 1 | 1 | 0 | 0read | |
| 1 | 0100 | 1 | 0000 | 0000 | x | 1 | 1 | 1 | 1read | |
| 0 | 0100 | 1 | 0000 | 0100 | x | 1 | 1 | 0 | 0read | Remarked cell "0000" |
| 0 | 0011 | 1 | 0000 | 0011 | x | 1 | 1 | 0 | 0read | ⎫ |
| 1 | 0001 | 1 | 0000 | 0000 | 0 | 0 | 0 | 1 | 0write | |
| 0 | 0001 | 0 | 0000 | 0001 | x | 1 | 1 | 0 | 0read | |
| 1 | 0000 | 1 | 1000 | 1000 | 1 | 0 | 0 | 1 | 1write | ⎫ |
| 0 | 0000 | 1 | 1000 | 0000 | x | 1 | 1 | 0 | 0read | |
| 1 | 1000 | 1 | 1000 | 1000 | x | 1 | 1 | 1 | 1read | |
| 0 | 1000 | 1 | 1000 | 1000 | x | 1 | 0 | 0 | — | |
| 1 | 0100 | 1 | 1000 | 1000 | x | 1 | 1 | 1 | 1read | |
| 0 | 0100 | 1 | 1000 | 0100 | x | 1 | 1 | 0 | 0read | Remarked cell "1000" |
| 0 | 0011 | 1 | 1000 | 0011 | x | 1 | 1 | 0 | 0read | ⎫ |
| 1 | 0001 | 1 | 1000 | 1000 | 0 | 1 | 0 | 1 | 0write | |
| 0 | 0001 | 0 | 1000 | 0001 | x | 1 | 1 | 0 | 0read | |
| 1 | 0000 | 1 | 0100 | 0100 | 1 | 0 | 0 | 1 | 1write | ⎫ |
| 0 | 0000 | 1 | 0100 | 0000 | x | 1 | 1 | 0 | 0read | |
| 1 | 1000 | 1 | 0100 | 0100 | x | 1 | 1 | 1 | 1read | |
| 0 | 1000 | 1 | 0100 | 1000 | x | 1 | 1 | 0 | 0read | |
| 1 | 0100 | 1 | 0100 | 0100 | x | 1 | 1 | 1 | 1read | |
| 0 | 0100 | 1 | 0100 | 0100 | x | 1 | 0 | 1 | — | |
| 1 | 0010 | 1 | 0100 | 0100 | x | 1 | 1 | 0 | 1read | Remarked cell "0100" |
| 0 | 0010 | 1 | 0100 | 0010 | x | 1 | 1 | 1 | 0read | |
| 1 | 0011 | 1 | 0100 | 0100 | x | 1 | 1 | 1 | 1read | |
| 0 | 0011 | 1 | 0100 | 0011 | x | 1 | 1 | 0 | 0read | |
| 1 | 0001 | 1 | 0100 | 0100 | 0 | 0 | 0 | 1 | 0write | |
| 0 | 0001 | 0 | 0100 | 0001 | x | 1 | 1 | 0 | 1read | |

Table 3 summarizes a memory test using the ping-pong pattern. However, note that Table 3 shows the procedure from a state in which "0" is already written in all addresses in the RAM 2A.

(Step 1) "0" is written into all memory cells. The writing may be achieved by the RAM-BIST circuit 7, or by the logic portion 5 with externally applied signal, or it may be achieved directly from the external.

(Step 2) The control portion 71 renders the shift inhibit signal sinh-0 "1", the write signal siw "0" and the comparison signal compen "0". The RAM-BIST circuit 7 writes "1" in a remarked cell (address "0000") according to an address signal generated by the LFSR 75 of the test pattern generating portion 70A. At this time, the RAM 2A is provided with data "1111".

(Step 3) The control portion 71 renders the write signal siw "1" and the comparison signal compen "1". The RAM-BIST circuit 7 performs reading of data from the RAM 2A and comparison between the read data D00–D03 and the expected value EXP with random addresses.

The reading order is "1000→0000→0100→0000→. . . 0011" according to the ping-pong pattern which the test pattern generating portion 70A generates with the shift inhibit signal sinh-0 alternately switching between "1" and "0".

(Step 4) The control portion 71 monitoring the output of the test pattern generating portion 70 renders the write signal siw "0" and the comparison signal compen "0" at the timing next to output of "0011" from the LFSR 75. The RAM-BIST circuit 7 writes "0" at address "0000" with the address signal generated by the LFSR 76 of the test pattern generating portion 70A.

(Step 5) As the LFSR 75 generates "0001", the control portion 71 renders the write signal siw "1" and the comparison signal compen "1". Reading of data from the RAM 2A about address "0001" generated by the test pattern generating portion 70A and comparison between the read data D00–D03 and the expected values EXP are performed.

(Step 6) The control portion 71 renders the shift inhibit signal sinh-0 "1", the write signal siw "0" and the comparison signal compen "0". According to the address signal generated by the test pattern generating portion 70 A, a remarked cell is set to "1000", and the RAM-BIST circuit 7 writes "1" in address "1000".

(Step 7) The control portion 71 renders the write signal siw "1" and the comparison signal compen "1". The RAM-BIST circuit 7 performs data reading from the RAM 2A and comparison between read data D00–D03 and the expected value EXP.

This reading order is "0000→1000→0100→1000→ . . . 0011" according to the ping-pong pattern generated by the test pattern generating portion 70A with the shift inhibit signal sinh-0 alternately switching to "1" and "0".

(Step 8) Monitoring output of the test pattern generating portion 70, the control portion 71 renders the write signal siw "0" and the comparison signal compen "0" at the timing next to output of "0011" from the LFSR 75. The RAM-BIST circuit 7 writes "0" at address "1000" generated by the LFSR 76.

(Step 9) When the LFSR 75 generates "0001", the control portion 71 renders the write signal siw "1" and the comparison signal compen "1". Data reading for the address "0001" generated by the test pattern generating portion 70A and comparison between the read data D00–D03 and the expected value EXP are performed.

(Step 10) The operations in Steps 2–9 are repeated while the remarked cell is changed according to addresses generated by the test pattern generating portion 70A.

In Step 3 and Step 7, if outputs of the LFSR's 75 and 76 match, the comparison signal compen goes "0" and the comparison portion 72 is inhibited from comparison.

When the test pattern generating portion 70A shown in FIG. 2 is used in this way, generated address signals are capable of addressing which can be regarded as the ping-pong pattern though in a random order. To implement the ping-pong pattern exactly, the Step 5 must be executed before the Step 4. If a memory test is performed with the above-described ping-pong pattern, however, the number of memory cells is more than tens of thousands (e.g. the number of memory cells is eight millions in a 8M-bit DRAM), and the number of times of reading the memory cell at the address "1000" is decreased but writing is applied to the memory cell at that address and interference with other memory cells is tested, therefore it is substantially effective as a test result with the ping-pong pattern.

Figure 4:
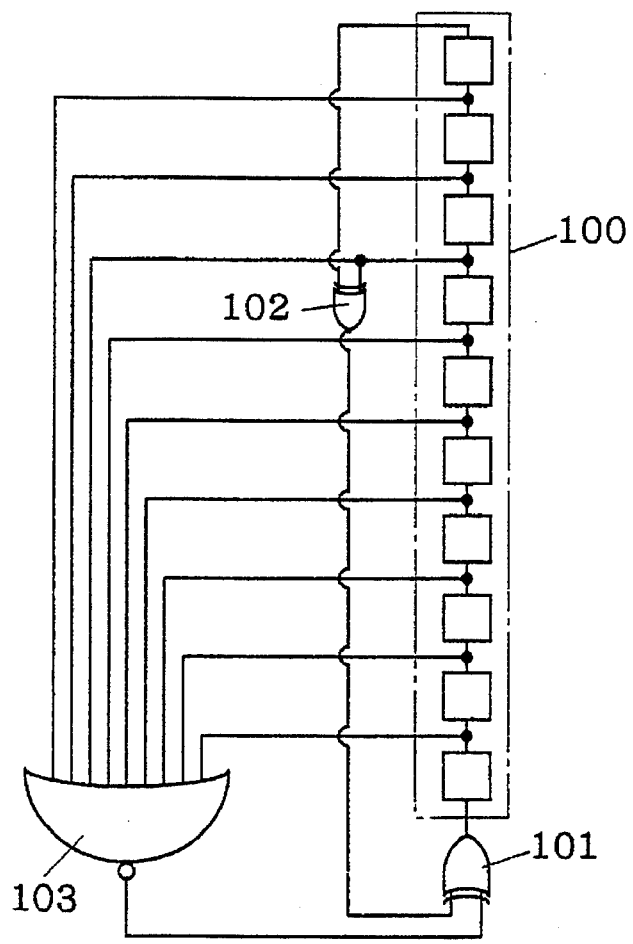
FIG. 4 is a logic diagram showing a configuration of a 10-order LFSR.
Figure 10:
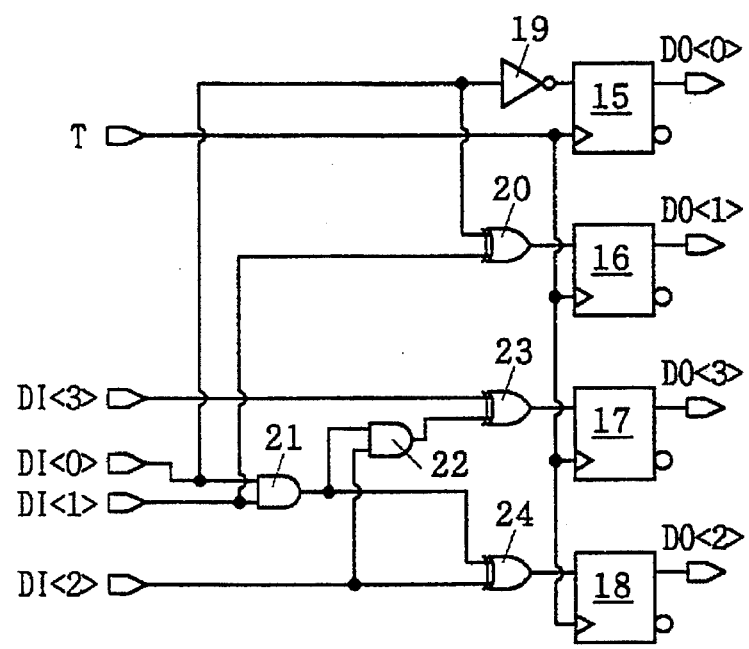
FIG. 10 is a logic diagram showing a configuration of a 4-bit counter.
Figure 11:
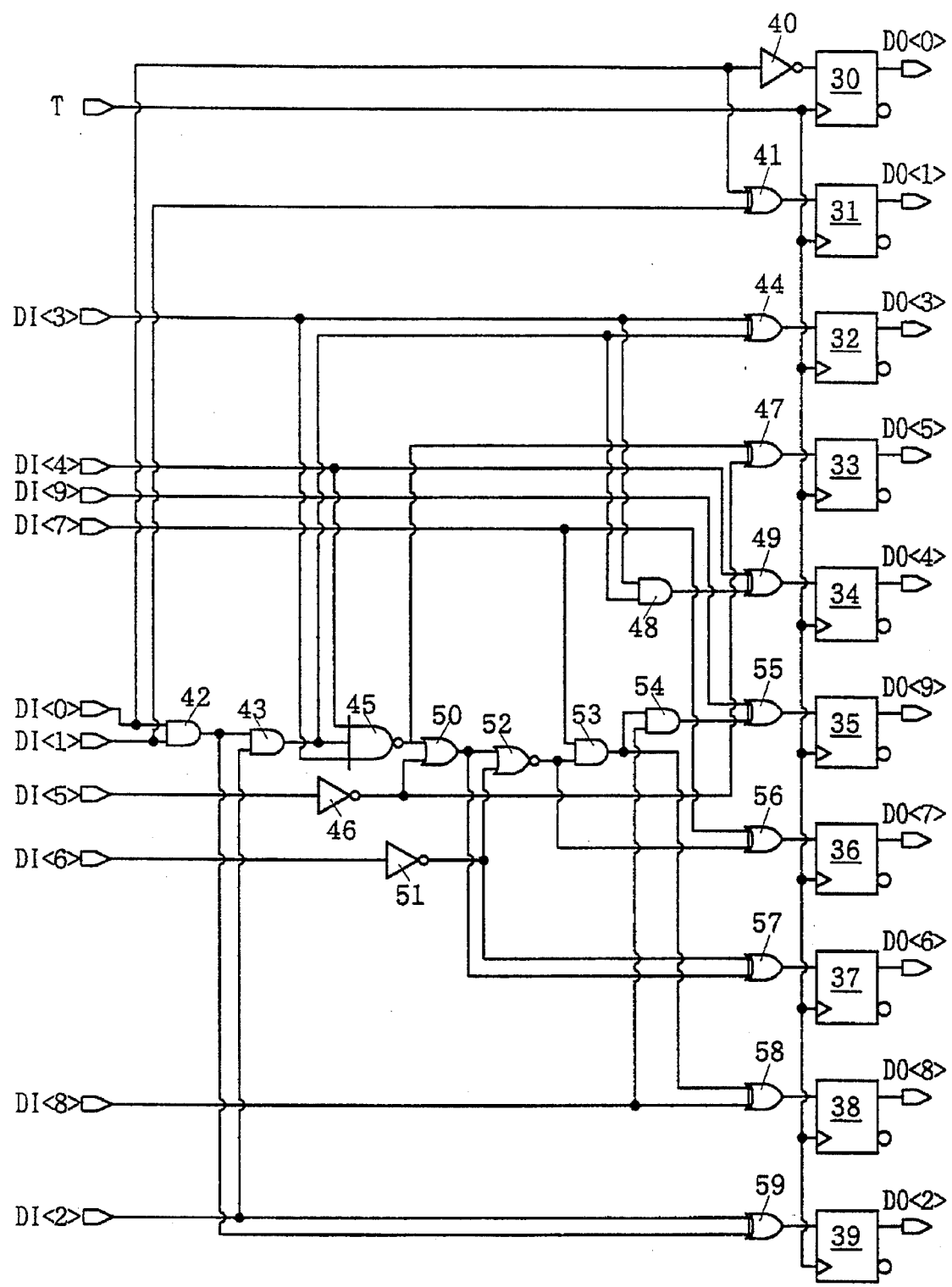
FIG. 11 is a logic diagram showing a configuration of a 10-bit counter.
Figure 12:
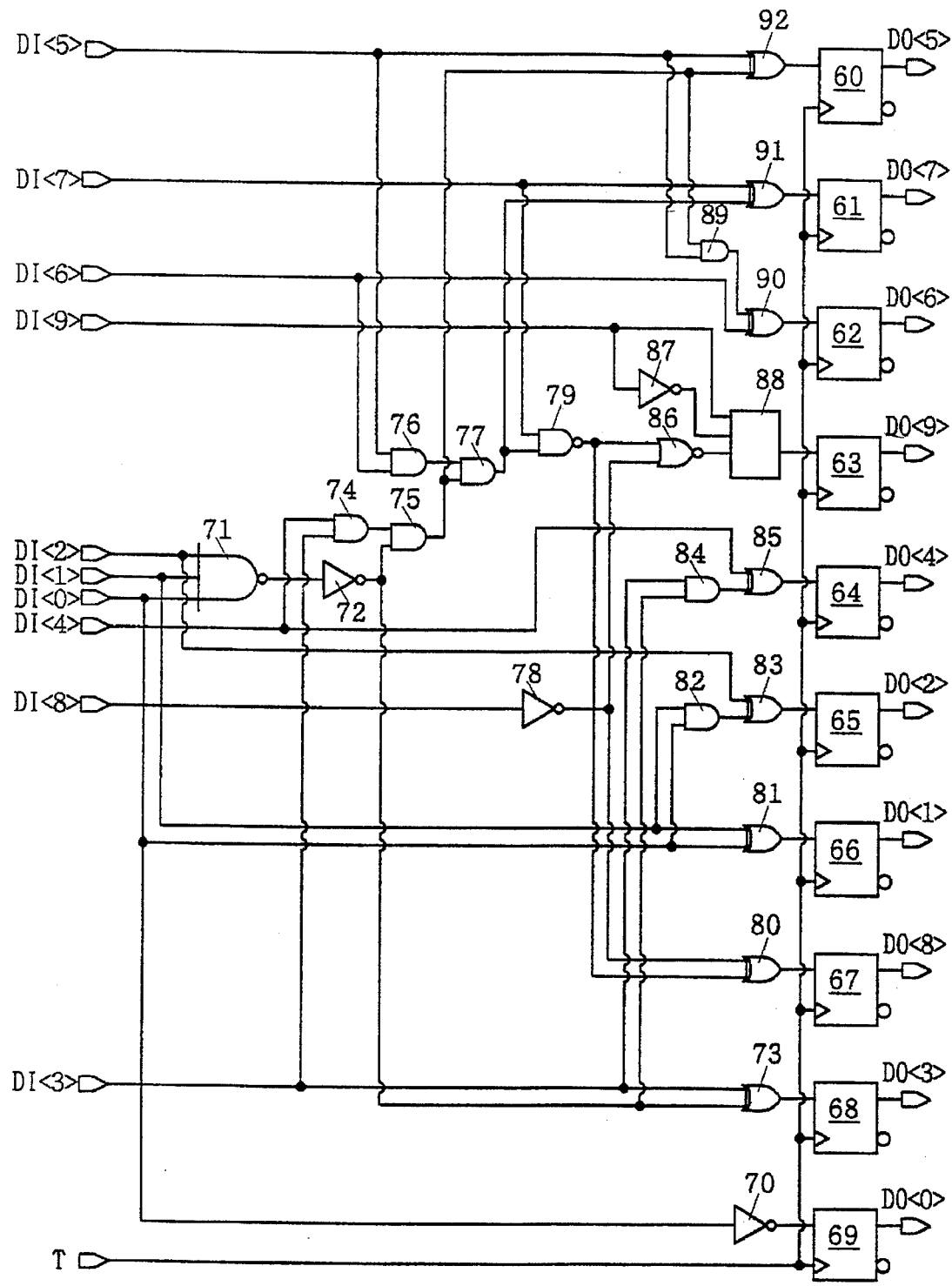
FIG. 12 is a logic diagram showing a configuration of a high speed 10-bit counter.

An LFSR, having a simpler circuit as compared with a counter, can increase the operating speed of the test pattern generating portion 70A. Furthermore, forming individual address generating circuits with the LFSR's 75 and 76 and the NOR gates 81 and 86 as shown in FIG. 2 enables a configuration with a smaller circuit as compared with the case where the conventional counters as shown in FIG. 10–FIG. 12 are used. The LFSR's 75 and 76 formed of shift registers show the effect of reducing the scale of the circuit more considerably as the number of addresses of a tested circuit increases. FIG. 4 is a logic diagram showing a configuration of a 10-order LFSR. In FIG. 4, 100 denotes a shift register, 102 denotes an XOR gate for outputting "0" when the most significant bit and the seventh bit outputted by the shift register 100 match, 103 denotes an NOR gate for outputting "1" when outputs of registers are all "0", and 101 denotes an XOR gate for outputting "0" to the least significant bit of the shift register 100 when the output of the XOR gate 102 and the output of the NOR gate 103 match.

It is seen that transformation of the 10-bit counter shown in FIG. 11 into the 10-order LFSR shown in FIG. 4 can remove a larger number of logic elements as compared with transformation of the 4-bit counter shown in FIG. 10 into the 4-order LFSR shown in FIG. 2.

By stopping the T flip-flop 77 and fixing as sinh-0=0 in the test pattern generating portion 70A shown in FIG.2, it can also be used as an address generating circuit generating pseudo-random numbers.

Second Preferred Embodiment

Figure 5:
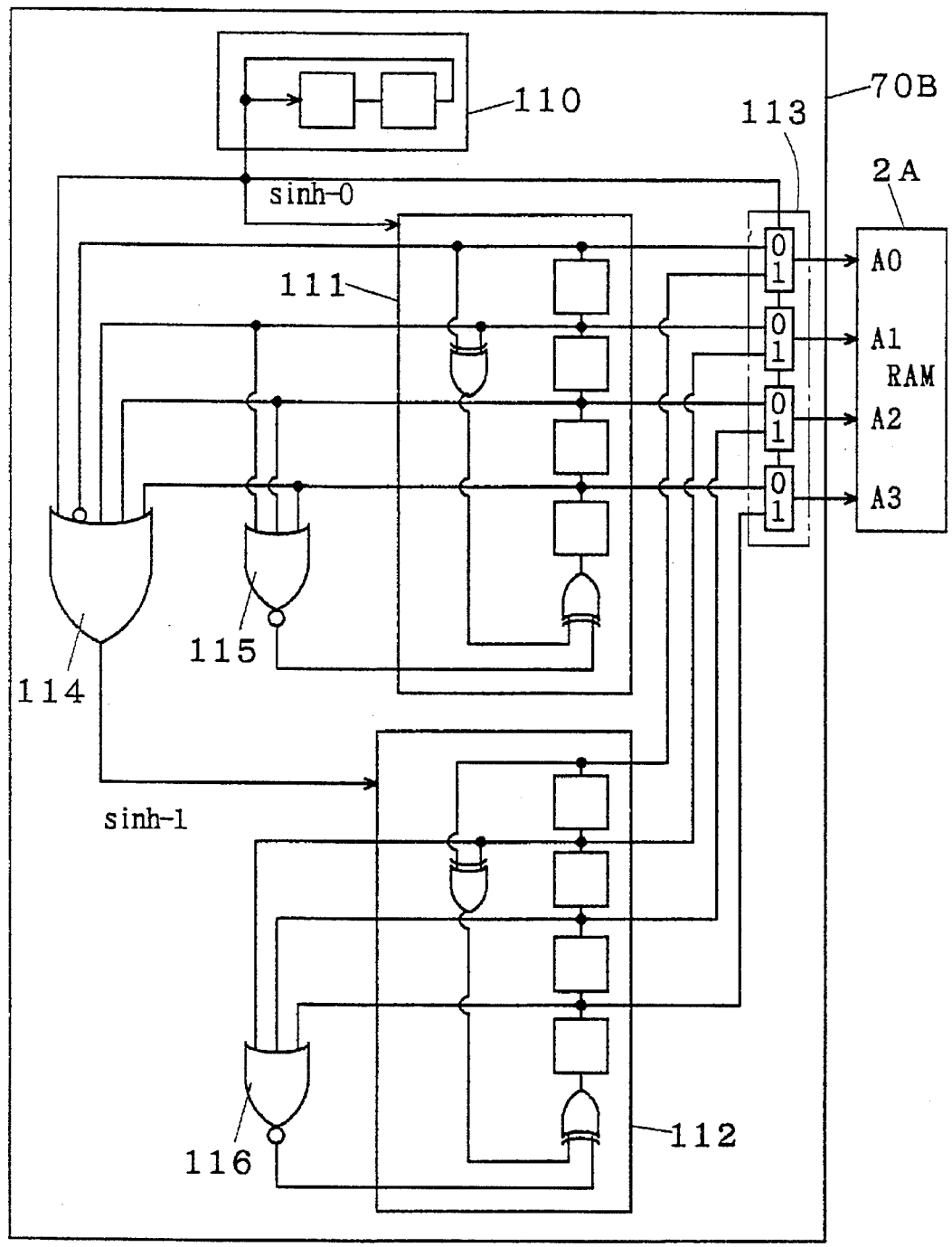
FIG. 5 is a logic diagram showing a configuration of a test pattern generating portion according to a second preferred embodiment of the present invention.

A configuration of a test pattern generating portion according to a second preferred embodiment of the present invention is shown in FIG. 5. As shown in FIG. 5, in the test pattern generating portion 70B according to the second preferred embodiment, the T flip-flop 77 used in the test pattern generating portion 70A according to the first preferred embodiment is replaced by a 2-bit shift register 110. Accordingly, in the test pattern generating portion 70B, the shift register 110 generates the shift inhibit signal sinh-0.

LFSR's 111 and 112 and the NOR gates 115 and 116 as first and second address generating circuits shown in FIG. 5 have the same structure as the LFSR's 75 and 76 and the NOR gates 81 and 86 shown in FIG. 2, and a selector circuit 113 in FIG. 5 has the same structure as the selector circuit 78 shown in FIG. 2. The relation of connection among the LFSR's 111 and 112, the selector circuit 113 and the OR gate 114 is the same as the relation of connection among the LFSR's 75 and 76, the selector circuit 78 and the OR gate 83.

The test pattern generating circuit 70B shown in FIG. 5 has two ways of use to be selected for generating the ping-pong pattern and for generating pseudo-random numbers according to a value initially set in the 2-bit ring counter 110.

When "01" is initially set in the ring counter 110, the output sinh-0 of the 2-bit ring counter 110 generates 010101 . . . , operating in the same way as the T flip-flop 77 of the first preferred embodiment. Accordingly, the test pattern generating portion 70B shown in the second preferred embodiment performs the same operation as the test pattern generating portion 70A shown in the first preferred embodiment.

When "00" is initially set in the ring counter 110, the output sinh-0 of the 2-bit ring counter 110 generates 0000 . . . . As the output sinh-0 of the ring counter 110 is a shift inhibit signal for the LFSR111, the LFSR 111 generates the pseudo-random numbers shown in Table 1 and outputs them to the RAM 2A through the selector circuit 113.

This way, the test pattern generating portion 70B shown in the second preferred embodiment, having extended functions, can generate and output pseudo-random numbers and ping-pong pattern.

Third Preferred Embodiment

Figure 7:
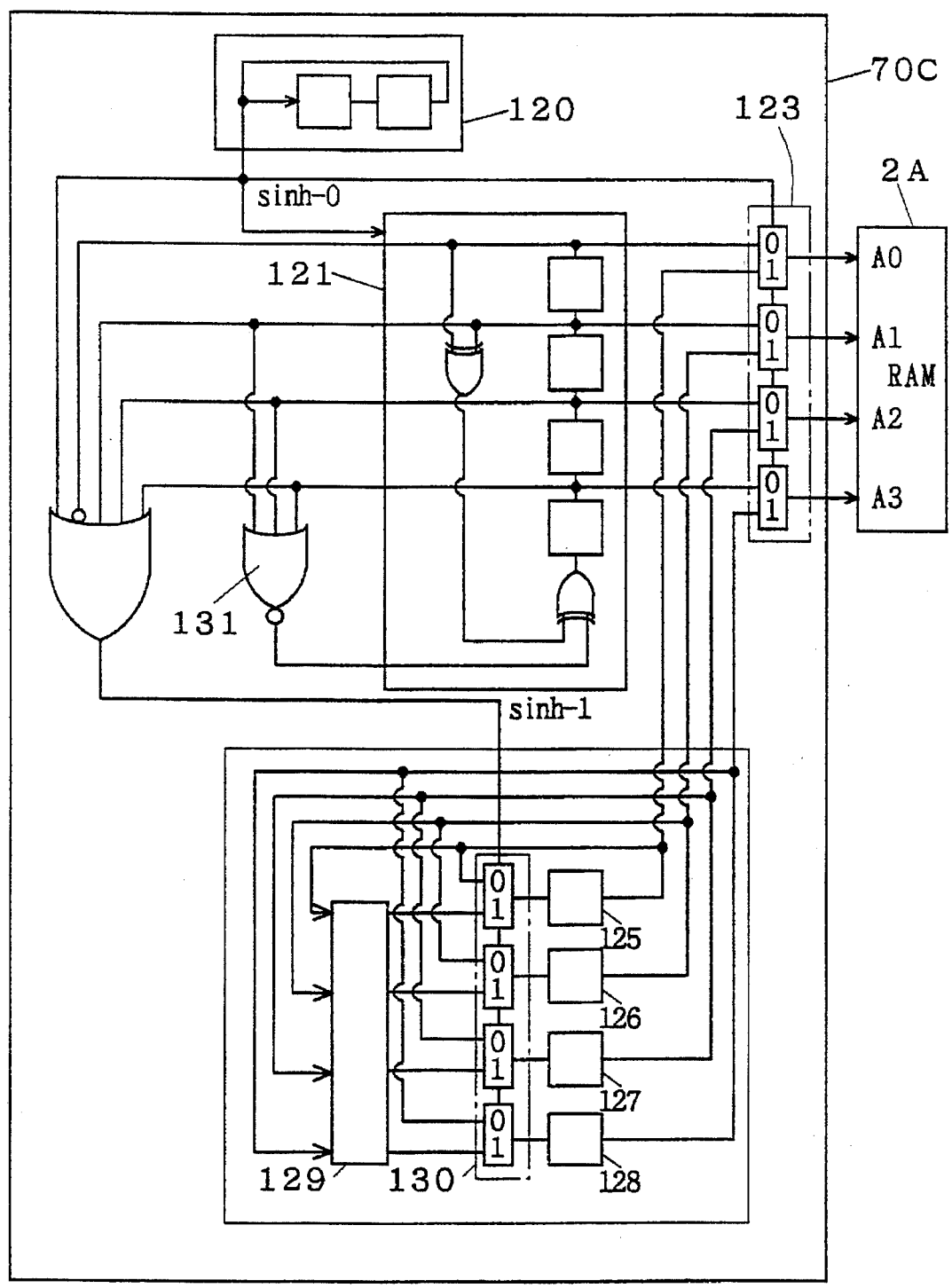
FIG. 7 is a block diagram showing a configuration of the counter shown in FIG. 6.
Figure 8:
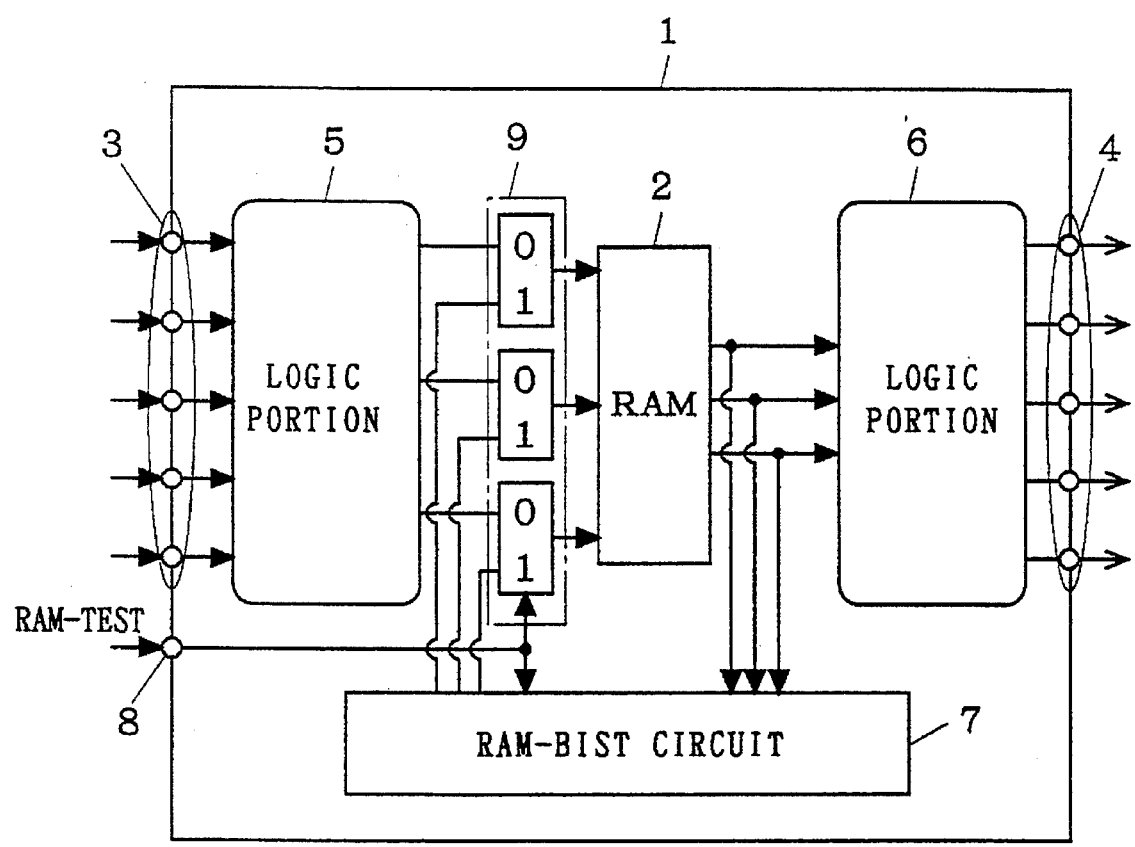
FIG. 8 is a block diagram showing a configuration of a memory device having a RAM-BIST circuit.
Figure 9:
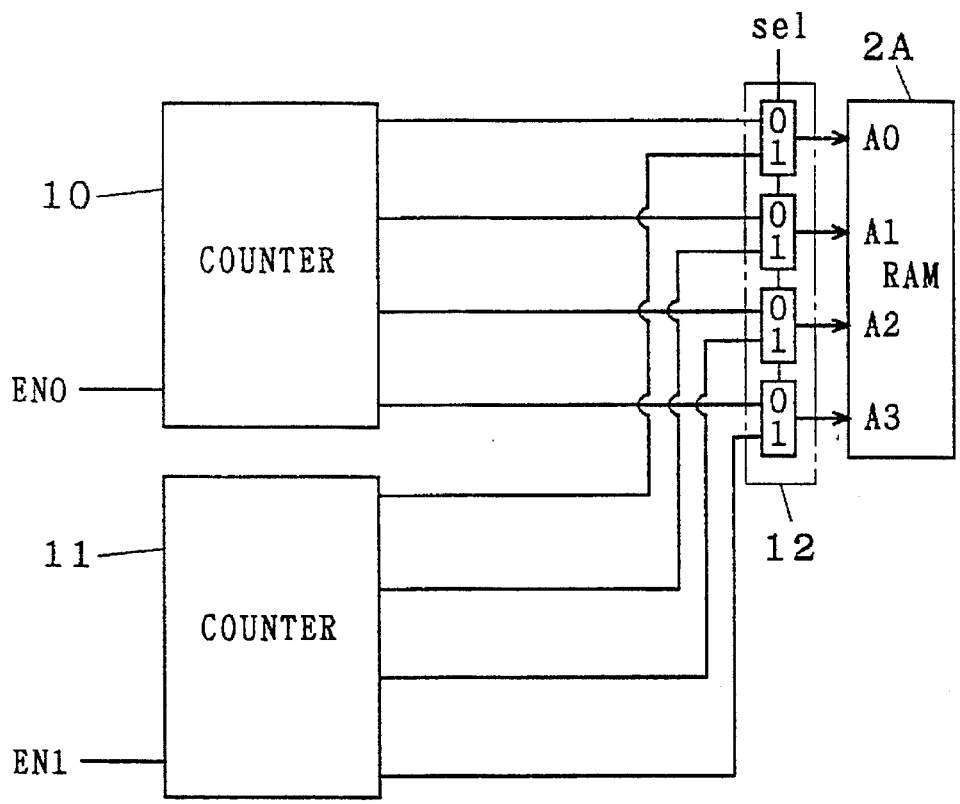
FIG. 9 is a block diagram for illustrating a configuration of the RAM-BIST circuit shown in FIG. 8.

FIG. 7 is a block diagram showing a configuration of a test pattern generating portion according to a third preferred embodiment of the present invention. In the third preferred embodiment, as shown in FIG. 7, the LFSR 112 and the NOR gate 116 which are the second address generating circuit in the test pattern generating portion 70B shown in the second preferred embodiment are replaced by a counter.

The test pattern generating portion generating the ping-pong pattern shown in FIG. 7 includes an LFSR 121 and an NOR gate 131, an OR gate 124 for detecting whether the LFSR 121 has generated one cycle of test patterns, a counter 122 for counting outputs of the OR gate 124, a selector circuit 123 for selecting outputs of one of the LFSR 121 and the counter 122, and a 2-bit ring counter 120 for providing the selector circuit 124 with timing for selection.

This test pattern generating portion 70C increases address of a remarked cell one by one using the counter 122, and generates addresses for other cells with pseudo-random numbers using the LFSR 121.

Figure 6:
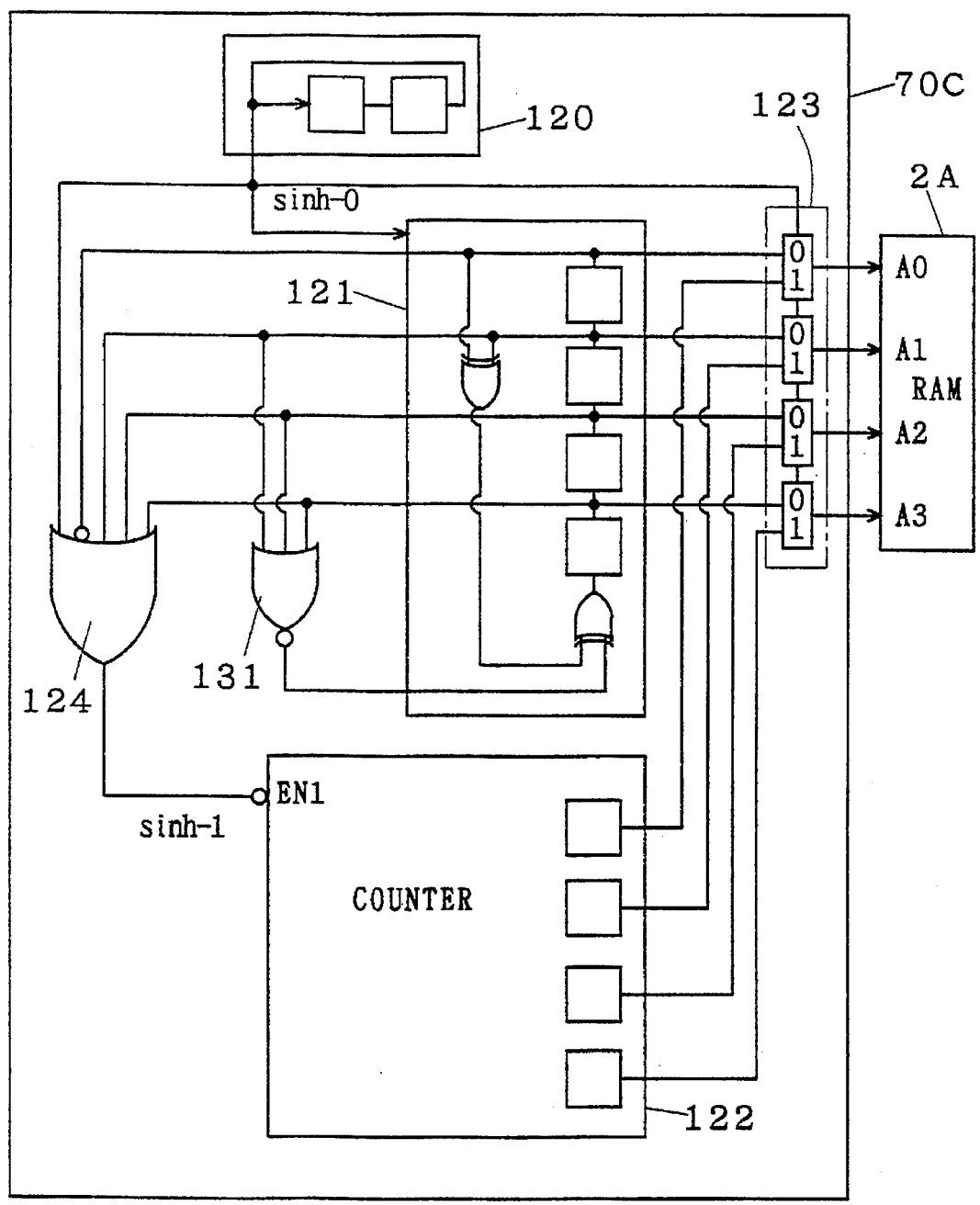
FIG. 6 is a block diagram showing a configuration of a test pattern generating portion according to a third preferred embodiment of the present invention.

In FIG. 6, EN1 is an enable signal for the counter 122. The counter 122 operates when the enable signal EN1=0 and holds the previous value when EN1=1. In the same way as the OR gate 83 of the test pattern generating portion 70A shown in FIG. 2 of the first preferred embodiment, the enable signal EN1 becomes a shift inhibit signal sinh-1=0 only when "0001" is held in the shift register of the LFSR 121. Accordingly, the count value of the counter 122 increases one by one every time the LFSR 121 generates pseudo-random numbers for one cycle.

The counter 122 increases the output value one by one for number of words of the tested circuit (RAM 2A)×2 cycles. In FIG. 6, as the tested circuit is of 16 words, it increases the count number by one every time the clock proceeds 32 cycles. As the counter 122 is not required to operate at high speed, it can be configured with a smaller circuit scale as compared with a counter operating with the clock provided to the test pattern generating portion 70C.

FIG. 7 is a block diagram for describing the test pattern generating portion shown in FIG. 6 in more detail. As shown in FIG. 7, the counter includes D flip-flops 125–128 as many as the addresses of the tested circuit (RAM 2A), an incrementer 129 provided with input signal having as many bits as the addresses of the tested circuit, and a selector circuit 130 for providing any of outputs of the incrementer 129 and outputs of the D flip-flops 125–128 to inputs of the D flip-flops 125–128. Now, the incrementer is a device for adding one to an input signal and output the added value. For example, such a 4-bit incrementer can be formed with a circuit shown in FIG. 10. The output data DO<0>–DO<3> have values larger by one than the input data DI<0>–DI<3> of the circuit shown in FIG. 10. A 10-bit incrementer can be realized with the circuits shown in FIG. 11 and FIG. 12, and the output data DO<0>–DO<9> have values larger by one than the input data DI<0>–DI<9>.

While the invention has been described in detail, the foregoing description is in all aspects illustrative and not restrictive. It is understood that numerous other modifications and variations can be devised without departing from the scope of the invention.

I claim:

1. A memory test circuit, comprising:

selection signal generating means for repeatedly outputting a selection signal;

a first address signal generating circuit which updates a first address signal generated to select a memory cell in a memory in response to said selection signal received from said selection signal generating means;

a second address signal generating circuit which updates a second address signal generated for selection of said memory cell every time said first address signal generating circuit has finished outputting all kinds of said first address signals once; and a selector circuit receiving said first and second address signals which said first and second address signal generating circuits generate, for selecting one of said first and second address signals with said selection signal provided from said selection signal generating means and outputting the signal as selected to said memory;

said first address signal generating circuit including, a first linear feedback shift register having a plurality of first registers connected in series, and a first exclusive OR circuit having an output terminal connected to the first register on the first stage in said plurality of first registers, a first input terminal connected to a first feedback path, and a second input terminal, and a first NOR gate for executing NOT-OR operation of outputs of all said first registers except the first register on the final stage in said plurality of first registers and outputting its result to said second input terminal of said first exclusive OR circuit.

2. The memory test circuit according to claim 1, wherein said memory test circuit is provided in the same chip with said memory, and said memory test circuit further comprises, comparing means for comparing an output of said memory and an expected value, and control means for generating a comparison control signal for inhibiting comparing operation of said comparing means when said first and second address signals are the same.

3. The memory test circuit according to claim 1, wherein said selection signal generating means comprises a ring counter including two registers into which initial data can be inputted from the external of said memory test circuit and connected in the form of a ring.

4. The memory test circuit according to claim 3, wherein said memory test circuit is provided in the same chip with said memory, and said memory test circuit further comprises, comparing means for comparing an output of said memory and an expected value, and control means for generating a comparison control signal for inhibiting comparing operation of said comparing means when said first and second address signals are the same.

5. The memory test circuit according to claim 1, wherein said second address signal generating circuit comprises, a second linear feedback shift register having a plurality of second registers connected in series and a second exclusive OR circuit having an output terminal connected to the second register on the first stage in said plurality of second registers, a first input terminal connected to a second feedback path and a second input terminal, and a second NOR gate for executing NOT-OR operation of outputs of all said second registers except the second register on the final stage in said second plurality of registers and outputting its result to said second input terminal of said second exclusive OR circuit.

6. The memory test circuit according to claim 5, wherein said memory test circuit is provided in the same chip with said memory, and said memory test circuit further comprises, comparing means for comparing an output of said memory and an expected value, and control means for generating a comparison control signal for inhibiting comparing operation of said comparing means when said first and second address signals are the same.

7. The memory test circuit according to claim 5, wherein said selection signal generating means comprises a ring counter formed of two registers into which initial data can be inputted from the external of said memory test circuit and connected in the form of a ring.

8. The memory test circuit according to claim 7, wherein said memory test circuit is provided in the same chip with said memory, and further comprises, comparing means for comparing an output of said memory and an expected value, and control means for generating a comparison control signal for inhibiting comparing operation of said comparing means when said first and second address signals are the same.

9. The memory test circuit according to claim 1, further comprising detecting means for detecting that all kinds of said first address signals have been outputted once by said first address signal generating circuit, wherein said second address signal generating circuit includes a counter for counting outputs of said detecting means.

10. The memory test circuit according to claim 9, wherein said memory test circuit is provided in the same chip with said memory, and further comprises, comparing means for comparing an output of said memory and an expected value, and control means for generating a comparison control signal for inhibiting comparing operation of said comparing means when said first and second address signals are the same.

11. The memory test circuit according to claim 9, wherein said selection signal generating means comprises a ring counter formed of two registers into which initial data can be inputted from the external of said memory test circuit and connected in the form of a ring.

12. The memory test circuit according to claim 11, wherein said memory test circuit is provided in the same chip with said memory, and further comprises, comparing means for comparing an output of said memory and an expected value, and control means for generating a comparison control signal for inhibiting comparing operation of said comparing means when said first and second address signals are the same.

* * * * *